United States Patent
Cortes Mayol et al.

(10) Patent No.: US 10,497,803 B2
(45) Date of Patent: Dec. 3, 2019

(54) FULLY DEPLETED SILICON ON INSULATOR (FDSOI) LATERAL DOUBLE-DIFFUSED METAL OXIDE SEMICONDUCTOR (LDMOS) FOR HIGH FREQUENCY APPLICATIONS

(71) Applicant: GLOBALFOUNDRIES INC., Grand Cayman (KY)

(72) Inventors: Ignasi Cortes Mayol, Dresden (DE); Christian Schippel, Dresden (DE); Alban Zaka, Dresden (DE); Tom Herrmann, Dresden (DE); El Mehdi Bazizi, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/671,590

(22) Filed: Aug. 8, 2017

(65) Prior Publication Data

US 2019/0051747 A1 Feb. 14, 2019

(51) Int. Cl.
*H01L 29/78* (2006.01)
*H01L 29/66* (2006.01)
*H01L 21/02* (2006.01)
*H01L 29/786* (2006.01)
*H01L 29/10* (2006.01)
*H01L 29/423* (2006.01)

(52) U.S. Cl.
CPC .... *H01L 29/7824* (2013.01); *H01L 21/02126* (2013.01); *H01L 29/1087* (2013.01); *H01L 29/66674* (2013.01); *H01L 29/66681* (2013.01); *H01L 29/66696* (2013.01); *H01L 29/66704* (2013.01); *H01L 29/7801* (2013.01); *H01L 29/786* (2013.01); *H01L 29/7825* (2013.01); *H01L 29/42376* (2013.01); *H01L 29/665* (2013.01)

(58) Field of Classification Search
CPC .......... H01L 29/7824; H01L 21/02126; H01L 29/66681; H01L 29/66674; H01L 29/7801
See application file for complete search history.

(56) References Cited

U.S. PATENT DOCUMENTS

| | | | | |
|---|---|---|---|---|
| 5,510,275 | A * | 4/1996 | Malhi | H01L 29/1033 257/192 |
| 8,133,789 | B1 * | 3/2012 | Cooper | H01L 21/046 257/327 |
| 2002/0171103 | A1 * | 11/2002 | Spadea | H01L 29/0653 257/328 |
| 2008/0179663 | A1 * | 7/2008 | Terashima | H01L 29/063 257/328 |

(Continued)

*Primary Examiner* — Feifei Yeung Lopez
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to fully depleted silicon on insulator (SOI) semiconductor structures and methods of manufacture. The structure includes: a gate structure formed over a semiconductor material; a source region adjacent to the gate structure; a drain region remote from the gate structure; and a drift region separating the gate structure from the drain region. The drift region includes an epitaxial material grown on the semiconductor material which increases the thickness of the semiconductor material in the drift region.

20 Claims, 3 Drawing Sheets

(56) References Cited

U.S. PATENT DOCUMENTS

| | | | |
|---|---|---|---|
| 2009/0070084 A1* | 3/2009 | Miura | G06F 17/5036 703/4 |
| 2013/0292764 A1* | 11/2013 | Yang | H01L 29/063 257/336 |
| 2015/0116029 A1* | 4/2015 | Litty | H01L 29/1079 327/534 |
| 2016/0027880 A1* | 1/2016 | Zeng | H01L 29/407 257/139 |
| 2017/0098609 A1* | 4/2017 | Harrington, III | H01L 21/28518 |

* cited by examiner

FULLY DEPLETED SILICON ON INSULATOR (FDSOI) LATERAL DOUBLE-DIFFUSED METAL OXIDE SEMICONDUCTOR (LDMOS) FOR HIGH FREQUENCY APPLICATIONS

FIELD OF THE INVENTION

The present disclosure relates to semiconductor structures and, more particularly, to fully depleted silicon on insulator (FDSOI) lateral double-diffused metal oxide semiconductor (LDMOS) for high frequency applications and methods of manufacture.

BACKGROUND

Thick oxide fully depleted semiconductor on insulator (FDSOI) devices operating at high ft (current gain cutoff frequency) and high fmax (maximum oscillation frequency) and having a high breakdown voltage (BV) are required for RF and switching applications. For example, a breakdown voltage of approximately 10V is required to enable a Drain voltage supply (Vdd) of 3.3 or 5V. Analysis shows, for example, that ft of approximately 150 GHz or above is required as well as fmax>ft.

FDSOI MOSFETs for high performance I/O applications can have promising potential in high power RF applications, e.g., RF amplifiers. RF power amplifiers based on I/O MOSFETs devices, though, can suffer stringent reliability requirements due to its relatively low breakdown voltage which is further degraded as the device gate length (Lg) is scale down.

SUMMARY

In an aspect of the disclosure, a structure comprises: a gate structure formed over a semiconductor material; a source region adjacent to the gate structure; a drain region remote from the gate structure; and a drift region separating the gate structure from the drain region. The drift region comprises an epitaxial material grown on the semiconductor material which increases the thickness of the semiconductor material in the drift region.

In an aspect of the disclosure, a structure comprises: a gate structure formed over a fully depleted semiconductor on insulator (FDSOI) material; and a drift region separating a drain region from the gate structure. The drift region comprises the FDSOI material and epitaxial growth material over the FDSOI material.

In an aspect of the disclosure, a method comprises: forming a gate structure formed over a semiconductor material; forming a source region adjacent to the gate structure and a drain region remote from the gate structure; and forming a drift region separating the gate structure from the drain region, the drift region comprising forming an epitaxial material grown on the semiconductor material to increase the thickness of the semiconductor material in the drift region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to fully depleted silicon on insulator (SOI) semiconductor structures and methods of manufacture. More specifically, the present disclosure relates to fully depleted SOI (FDSOI) lateral double-diffused MOS transistors for very high frequency applications. More specifically, the FDSOI LDMOS transistors described herein are thick oxide devices on FDSOI technology able to support ft>150 GHz at BV>10V to enable Vdd=3.3V (or higher), amongst other features. Advantageously, the FDSOI LDMOS transistors described herein exhibit a reduction of device (e.g., extended drain or drift region) resistance, amongst other features.

The FDSOI LDMOS transistors can be manufactured in a number of ways using a number of different tools. In general, though, the methodologies and tools are used to form structures with dimensions in the micrometer and nanometer scale. The methodologies, i.e., technologies, employed to manufacture the FDSOI LDMOS transistors of the present disclosure have been adopted from integrated circuit (IC) technology. For example, the structures are built on wafers and are realized in films of material patterned by photolithographic processes on the top of a wafer. In particular, the fabrication of the FDSOI LDMOS transistors use three basic building blocks: (i) deposition of thin films of material on a substrate, (ii) applying a patterned mask on top of the films by photolithographic imaging, and (iii) etching the films selectively to the mask.

Figure 1:
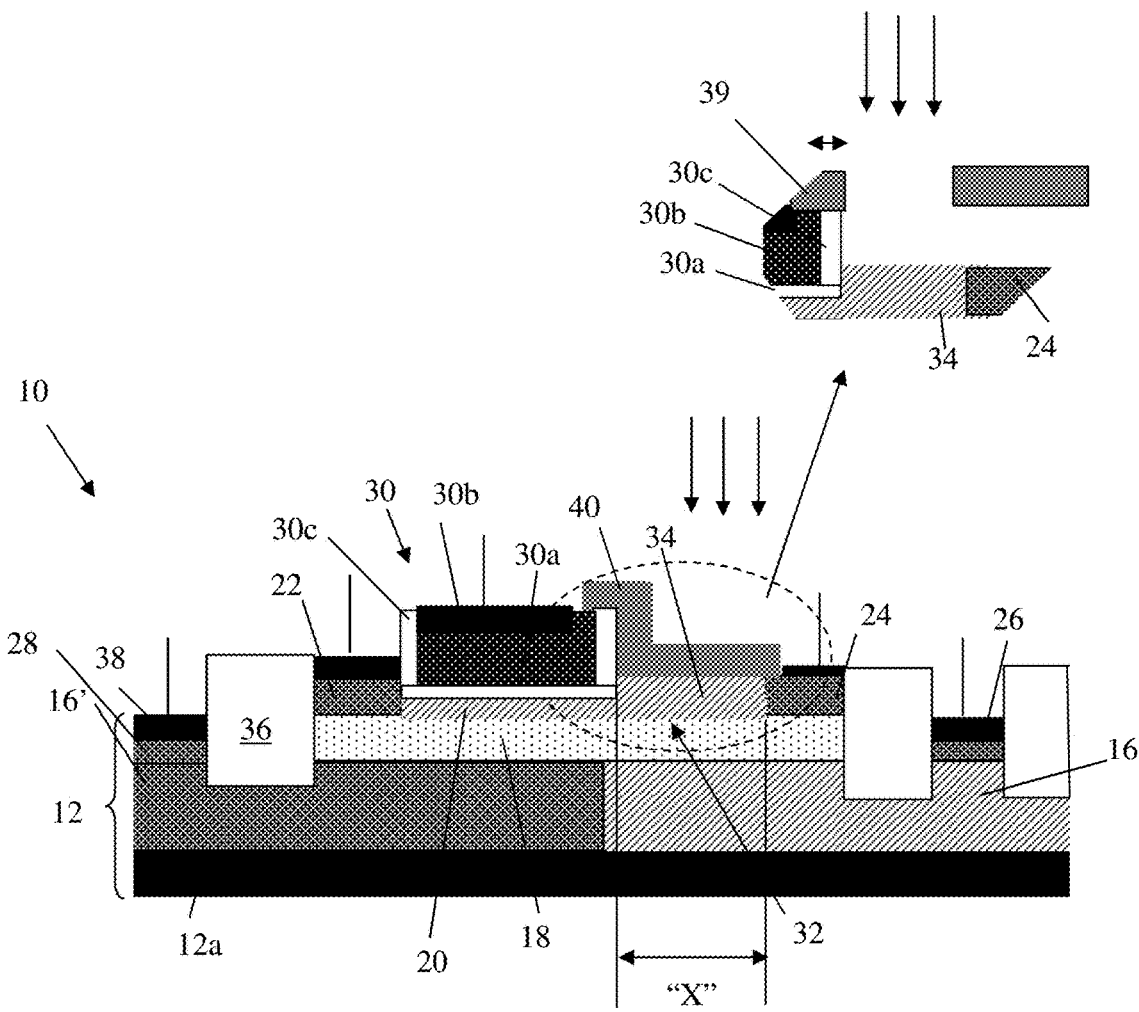
FIG. 1 shows a fully depleted structure with a selective epitaxial growth in a drift region, post-gate formation, and respective fabrication processes in accordance with aspects of the present disclosure.

FIG. 1 shows a fully depleted structure with a selective epitaxial growth in a drift region, post-gate formation, and respective fabrication processes in accordance with aspects of the present disclosure. More specifically, the structure 10 comprises an SOI substrate 12 comprising a P-type substrate 12a. The substrate 12 further includes both an N-well 16 and a P-well 16'. The N-well 16 and a P-well 16' can be doped or ion implanted using, e.g., boron, arsenic or phosphorous (with masking or blocking materials) at a conventional energy level. In alternative embodiments, the wells can be either a single P-well or a single N-well, depending on the specific design parameters of the device.

A buried oxide layer (BOX) 18 is above the N-well 16 and P-well 16'. In embodiments, the BOX layer 18 can have different permittivities including, e.g., that of $SiO_2$ or $Si_3N_4$.

In embodiments, the BOX layer 18 can have a thickness of about 5 nm to about 40 nm; although other dimensions are contemplated herein.

Still referring to FIG. 1, a fully depleted semiconductor layer 20 is on the BOX layer 18. In embodiments, the fully depleted semiconductor layer 20 may be composed of any suitable material including, but not limited to, Si, SiGe, SiGeC, SiC, GaAs, InAs, InP, and other III/V or II/VI compound semiconductors. In embodiments, the fully depleted semiconductor layer 20 will have an initial thickness of about 3 nm to about 15 nm, extending between a source region 22 and a drain region 24 (remote from a gate structure 30). In embodiments, both the source region 22 and the drain region 24 are N+ doped diffusion regions which can be defined by epitaxial growth. The structure also includes additional diffusion regions 26, 28 for N-type Back Gate (NBG) contacts or P-type Back Gate (PBG) contacts which can be defined by epitaxial growth, as examples.

A gate structure 30 is located on the fully depleted semiconductor layer 20. In embodiments, the gate structure 30 can have a length of approximately 40 nm to 50 nm (although other lengths are contemplated herein). The gate structure 30 includes a gate dielectric material 30a, a gate material (e.g., polysilicon) 30b and sidewalls 30c. In embodiments, the high-k dielectric gate material 30a can be a hafnium based dielectric, as an example. In further embodiments, examples of such high-k dielectrics include, but are not limited: $A_{12}O_3$, $T_{a2}O_3$, $Ti_{O2}$, $L_{a2}O_3$, $SrTiO_3$, $LaAlO_3$, $Zr_{O2}$, $Y_2O_3$, $Gd_2O_3$, and combinations including multilayers thereof. The gate material 30b, e.g., poly gate material, and the gate dielectric material 30a can be deposited and patterned using conventional deposition processes, e.g., chemical vapor deposition (CVD) and reactive ion etching (RIE) processes. The sidewall material 30c can be an oxide or nitride material, as is known in the art.

A drift region 32 extends between the edge of the gate structure 30 and the drain region 24. In embodiments implementing the split-backgate definition (e.g., N-well 16 and P-well 16'), it is contemplated that the N-well 16 will cover the drift region 32 with no overlap of the gate region 30. This allows a flat band voltage of the drift region which, in turn, tunes the Vt and boost the ft. It should also be recognized that positive NBG allows higher accumulation of electrons at the SOI region close to the BOX, thus reducing the drift region resistance, the on-state resistance, and in turns enhancing the ft.

Figure 2:
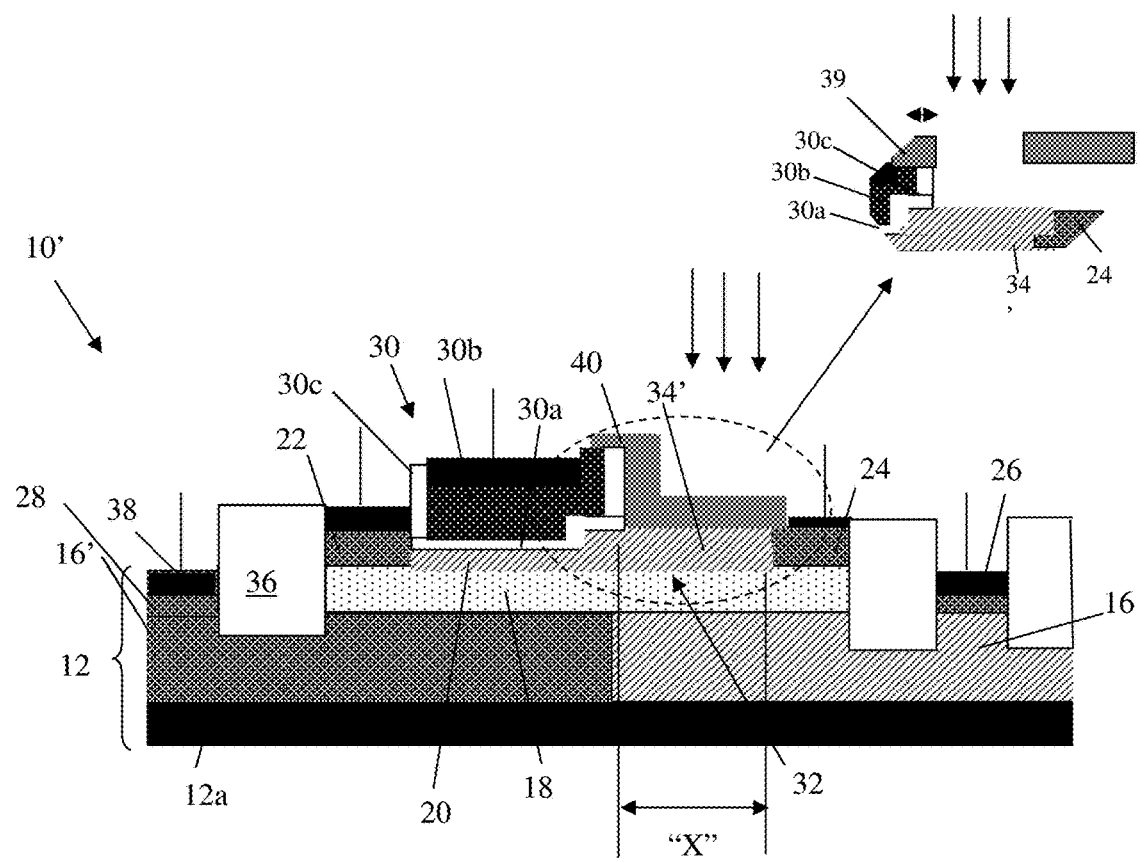
FIG. 2 shows a fully depleted structure with a selective epitaxial growth in a drift region, pre-gate formation, and respective fabrication processes in accordance with aspects of the present disclosure.

In embodiments, the drift region 32 can have a length "X" of about 20 nm to about 1000 nm, as examples. The drift region 32 includes an undoped epitaxial material 34 which extends (increases) the thickness of the drift region 32 (e.g., fully depleted semiconductor layer 20) to an additional 5 nm to about 15 nm, and preferably about 10 nm. In this implementation, the undoped epitaxial material 34 is a raised region formed by an epitaxial growth process defined post-gate formation (although the undoped epitaxial material can also be defined pre-gate formation as shown in FIG. 2). In embodiments, the undoped epitaxial material 34 is preferably the same material as the fully depleted semiconductor layer 20.

The undoped epitaxial material 34 will undergo an extended drain epitaxial ion implantation process using, e.g., phosphorous at a low energy, 2 keV to 10 keV, using masking material 39 to protect remaining portions of the device. In this implementation, the device will be an nLDMOS; however, in alternative embodiments, the undoped epitaxial material 34 can undergo an extended drain epitaxial ion implantation process using, e.g., boron, for a pLDMOS device. To improve reliability results obtained at small ft degradation, the masking material 39 can be shifted approximately 25 nm to about 50 nm away from the junction of the gate structure 30 and the drift region 32 (as schematically represented by the double arrow).

In more specific embodiments, the undoped epitaxial material 34 will undergo an extended drain epitaxial ion implantation processes using, e.g., phosphorous at 3e13, fully or partially covering the drift region 32. It is also contemplated herein that the drift region 32 can be fabricated using several ion implantation sequences in order to achieve the appropriate doping profile needed to withstand high electric fields, as an example. It should also be recognized that shifting the masking material 34 to the drain region 24 creates a low doped region at the gate/drift region which is beneficial for improving device reliability.

As further shown in FIG. 1, shallow trench isolation structures 36 are formed in the substrate 12 and are used to isolate certain components, e.g., contacts, etc. In embodiments, the shallow trench isolation structures 36 are formed by conventional lithography, deposition and etching processes as is known to those of skill in the art. In particular, a resist is exposed to energy (light) to form a pattern (opening). An etching process with a selective chemistry, e.g., reactive ion etching (RIE), will be used to form one or more trenches in the substrate 12 through the openings of the resist. The resist can then be removed by a conventional oxygen ashing process or other known stripants. Following the resist removal, an insulator material (e.g., oxide) can be deposited by any conventional deposition processes, e.g., chemical vapor deposition (CVD) processes. Any residual material on the surface of the structure can be removed by conventional chemical mechanical polishing (CMP) processes. In embodiments, both STI trenches are used to isolate the hybrid part (e.g., regions without SOT/BOX) from the RX part (e.g., regions with SOT/BOX).

Contacts 38 are formed on the source region 22, drain region 24, gate 30 and additional diffusion regions 26, 28. In embodiments, the contacts 38 are silicide regions formed using a mask 40 to protect the doped epitaxial material 34 of the drift region 32. As should be understood by those of skill in the art, the silicide process begins with deposition of a thin transition metal layer, e.g., nickel, cobalt or titanium, over fully formed and patterned semiconductor devices (e.g., source and drain regions, respective devices and other diffusion regions requiring a contact). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device. It should be understood by those of skill in the art that silicide contacts will not be required on the devices, when a gate structure is composed of a metal material.

FIG. 2 shows a fully depleted structure 10' with a selective epitaxial growth in a drift region, pre-gate formation, and respective fabrication processes in accordance with aspects of the present disclosure. As shown in FIG. 2, for example, the structure 10' includes a gate structure 30 which partially overlaps the raised epitaxial material 34', which effectively raises the gate structure 30.

More specifically, similar to that described with respect to FIG. 1, the structure 10' comprises an SOI substrate 12 comprising a P-type substrate 12a. The substrate 12 further includes both an N-well 16 and a P-well 16' or, alternatively, the wells can be either a single P-well or a single N-well, depending on the specific design parameters of the device. A fully depleted semiconductor layer 20 is located on the BOX layer 18. In embodiments, the fully depleted semiconductor layer 20 may be composed of any suitable material as already noted herein. In embodiments, the fully depleted semiconductor layer 20 will have an initial thickness of about 3 nm to about 15 nm, extending between a source region 22 and a drain region 24 (remote from a gate structure 30), e.g., N+ doped diffusion regions. The structure also includes additional diffusion regions 26, 28, as examples for, e.g., NBG and PBG.

Prior to forming the gate structure 30, undoped epitaxial material 34' is grown on the fully depleted semiconductor layer 20 to increase the thickness of the drift region 32 to an additional 5 nm to about 15 nm, and preferably about 10 nm. In this implementation, the undoped epitaxial material 34' is a raised region formed by an epitaxial growth process defined pre-gate formation. Preferably, the undoped epitaxial material 34' is preferably the same semiconductor material as the fully depleted semiconductor layer 20.

The gate structure 30 is formed on the fully depleted semiconductor layer 20 and partially overlapping the raised undoped epitaxial material 34'. As already described herein, the gate structure 30 includes a gate dielectric material 30a, a gate material 30b and sidewalls 30c, formed using conventional CMOS processes. The drift region 32 will now extends between the edge of the gate structure 30 and the drain region 24, and depending on the placement of the masking material 39 can have a length "X" of about 20 nm to about 1000 nm, as examples. The undoped epitaxial material 34' will undergo an extended drain epitaxial ion implantation processes using, e.g., phosphorous, as described in the different embodiments described herein.

As further shown in FIG. 2, shallow trench isolation structures 36 are formed in the substrate 12 and are used to isolate certain components, e.g., contacts, etc. In embodiments, the shallow trench isolation structures 36 are formed by conventional lithography, deposition and etching processes as is known to those of skill in the art. Contacts 38 are formed on the source region 22, drain region 24, gate 30 and additional diffusion regions 26, 28. In embodiments, the contacts 38 are silicide regions formed using a mask 40 to protect the doped epitaxial material 34' of the drift region 32.

Table 1 shows a simulation prediction of VT, ft and fmax using Technology Computer Aided Design (TCAD) tools for an NLDMOS transistor (Vdd=3.3V) with different Lg and drift region, post gate, of 150 nm. As shown in Table 1, the ft becomes higher as the gate length (Lg) becomes smaller. This table also shows that the parasitic capacitance decreases (as shown indirectly from the gm,sat and ft/fmax) as the gate length (Lg) becomes smaller. Also, by implementing the structures described herein, the same ft and higher fmax and breakdown voltage (BV) can be obtained with the same Lg, as compared to I/O MOSFET devices.

TABLE 1

| Gate Length (Lg) | Back Gate Bias (VNBG) | Threshold Voltage (Vt) (V) | gm, sat (S/um) | Current gain cutoff Frequency (ft) (GHz) | Maximum oscillation Frequency (fmax) (GHz) |
|---|---|---|---|---|---|
| 70 | 0 | 0.471 | 9.28E-04 | 104 | 308 |
|  | 3.3 | 0.411 | 1.12E-03 | 115 | 297 |
| 50 | 0 | 0.451 | 9.77E-04 | 130 | 343 |
|  | 3.3 | 0.361 | 1.19E-03 | 143 | 329 |
| 40 | 0 | 0.413 | 1.01E-03 | 153 | 368 |
|  | 3.3 | 0.279 | 1.26E-03 | 167 | 354 |
| 30 | 0 | 0.359 | 1.04E-03 | 174 | 388 |
|  | 3.3 | 0.182 | 1.31E-03 | 189 | 375 |

Figure 3:
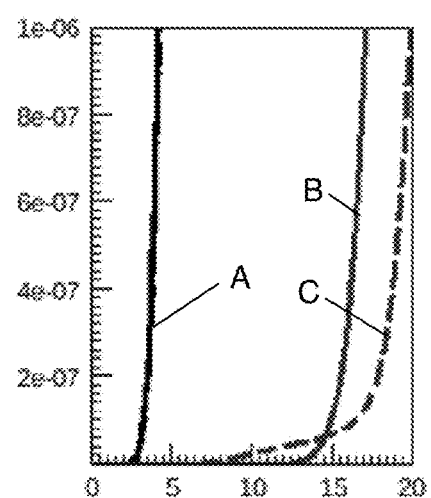
FIG. 3 shows a comparison graph of Id(Vd) at an off state of a I/O MOSFET device and the LDMOS device described herein, at the NBG=0 and NBG=Vdd.

FIG. 3 shows a comparison graph of Id(Vd) at the off state of an I/O MOSFET device and the devices presented herein, at the NBG=0 and NBG=Vdd. In this graph, line "A" represents a conventional device; whereas, line "B" represents a device with an extended drift region at NBG=0 and line "C" represents a device with an extended drift region at NBG=Vdd. At shown in the graph, the breakdown voltage for a conventional device (line "A") is approximately 4 volts. In comparison, the device with the extended drift region at NBG=0 has a breakdown voltage of approximately 15V as shown in line "B". Also, the device with an extended drift region at NBG=Vdd has a breakdown voltage of approximately 20V as shown in line "C".

Figure 4:
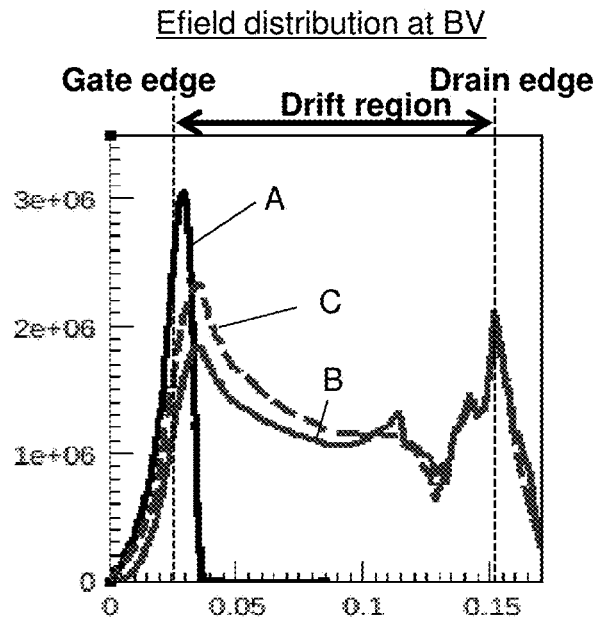
FIG. 4 shows a comparison graph of Efield distribution at a breakdown voltage of a I/O MOSFET device and the LDMOS device described herein, at both NBG=0 and NBG=Vdd.

FIG. 4 shows a comparison graph of Efield distribution at a breakdown voltage of an I/O MOSFET device and the devices presented herein, at both NBG=0 and NBG=Vdd. In embodiments, both devices have same Lg=50 nm. In this graph, line "A" represents a conventional device; whereas, line "B" represents a device with an extended drift region at NBG=0 and line "C" represents a device with an extended drift region at NBG=Vdd. At shown in the graph, the Efield distribution for a conventional device (line "A") is concentrated between 0 and 0.05. In comparison, the device with an extended drift region at NBG=0 (line "B") and at NBG=Vdd (line "C") has an improved distribution over a range from 0.0 to 0.15. As can be discerned, X=0 corresponds to the middle of the channel and, as such, the peak for the I/O MOSFET is located at the Gate edge/Spc region, and for the LDMOS the peak is slightly shifted toward the Drain.

Figure 5:
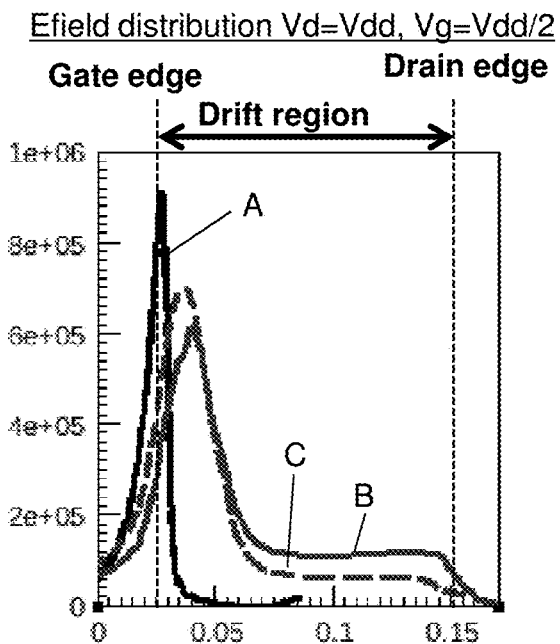
FIG. 5 shows a comparison graph of Efield distribution at Vd=Vdd and Vg=Vdd/2 of an I/O MOSFET device and the LDMOS device described herein, at both NBG=0 and NBG=Vdd.

FIG. 5 shows a comparison graph of Efield distribution at Vd=Vdd. Vg=Vdd/2 of a conventional LDMOS device and the devices presented herein, in both the NBG=0 and NBG=Vdd state. In this graph, line "A" represents a conventional device; whereas, line "B" represents a device with an extended drift region at NBG=0 and line "C" represents a device with an extended drift region at NBG=Vdd. At shown in the graph, for a conventional device (line "A") Vdd=1.2V; whereas, in comparison, the device with an extended drift region at NBG=0 (line "B") and NBG=Vdd (line "C") have a Vdd=3.3V, with improved reliability.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a gate structure formed over a semiconductor material;
    a source region adjacent to the gate structure;
    a drain region remote from the gate structure; and
    a drift region separating the gate structure from the drain region by extending from under a gate spacer at an edge of the gate structure to an edge of the drain region, the drift region comprising an epitaxial material under the gate spacer of which is thicker than a fully depleted semiconductor material under a remaining portion of the gate structure.

2. The structure of claim 1, wherein the semiconductor material is fully depleted semiconductor on insulator material (FDSOI).

3. The structure of claim 2, wherein FDSOI supports ft>150 GHz at BV>10V to enable at least Vdd=3.3.

4. The structure of claim 2, wherein the insulator material is a buried insulator comprising $SiO_2$ or $Si_3N_4$.

5. The structure of claim 1, further comprising a buried insulator below the source region and the drain region.

6. The structure of claim 1, wherein the gate structure is adjacent to the increased thickness of the drift region.

7. The structure of claim 1, wherein the epitaxial material grow has a thickness of about 5 nm to about 15 nm.

8. The structure of claim 1, wherein the epitaxial material is an ion implanted material.

9. The structure of claim 1, wherein the gate structure is over a P-well.

10. The structure of claim 1, wherein the gate structure is over an N-well.

11. A structure comprising:
    a gate structure formed over a fully depleted semiconductor on insulator (FDSOI) material;
    a drift region separating a drain region from the gate structure, the drift region extending under a gate spacer of the gate structure, the drift region comprising the FDSOI material and epitaxial material over the FDSOI material such that the combination of the FDSOI material and epitaxial material under the gate spacer and extending away therefrom is thicker than the FDSOI material under remaining portions of the gate structure; and
    an N-well covering the drift region with no overlap of the gate structure.

12. The structure of claim 11, wherein the gate structure has a length of about 40 nm to about 50 nm.

13. The structure of claim 11, wherein the epitaxial material has a thickness of about 5 nm to about 15 nm.

14. The structure of claim 11, wherein the epitaxial material is ion implanted material.

15. The structure of claim 11, wherein FDSOI material and the epitaxial material supports ft>150 GHz at BV>10V to enable at least Vdd=3.3.

16. The structure of claim 11, wherein the gate structure partially overlaps the epitaxial material.

17. The structure of claim 11, wherein the gate structure is adjacent to the epitaxial material.

18. The structure of claim 11, wherein the gate structure is over a P-well.

19. A method comprising:
    forming a gate structure formed directly on a surface of a semiconductor material;
    forming a source region adjacent to the gate structure and a drain region remote from the gate structure and directly adjacent to the semiconductor material; and
    forming a drift region, the drift region extending from under a gate spacer at an edge of the gate structure to an edge of the drain region to separate the gate structure from the drain region, the drift region comprising forming an epitaxial material grown under the gate spacer and directly on the semiconductor material between the edge of the gate structure to the edge of the drain region to increase the thickness of the semiconductor material in the drift region, wherein the epitaxial material grown under the gate spacer is thicker than a fully depleted semiconductor material under a remaining portion of the gate structure.

20. The method of claim 19, wherein the drift region is formed pre-gate formation.

* * * * *